US009513339B2

(12) United States Patent
Streit

(10) Patent No.: US 9,513,339 B2
(45) Date of Patent: Dec. 6, 2016

(54) DEVICE AND METHOD FOR EQUALIZING CURRENT DRAIN FROM A BATTERY STACK

(71) Applicant: Analog Devices, Inc., Norwood, MA (US)

(72) Inventor: Lawrence C. Streit, Noblesville, IN (US)

(73) Assignee: Analog Devices, Inc., Norwood, MA (US)

( * ) Notice: Subject to any disclaimer, the term of this patent is extended or adjusted under 35 U.S.C. 154(b) by 808 days.

(21) Appl. No.: 13/905,948

(22) Filed: May 30, 2013

(65) Prior Publication Data

US 2013/0320990 A1    Dec. 5, 2013

Related U.S. Application Data

(60) Provisional application No. 61/653,829, filed on May 31, 2012.

(51) Int. Cl.
*G01R 31/36* (2006.01)
*H02J 7/00* (2006.01)

(52) U.S. Cl.
CPC ....... *G01R 31/3606* (2013.01); *G01R 31/3658* (2013.01); *H02J 7/0016* (2013.01); *H02J 7/0021* (2013.01); *Y02T 10/7055* (2013.01)

(58) Field of Classification Search
CPC ........................................................ H02J 7/00
USPC ................................... 320/116; 324/425–433
See application file for complete search history.

(56) References Cited

U.S. PATENT DOCUMENTS

| 4,390,841 | A | 6/1983 | Martin et al. |
| 6,549,014 | B1 | 4/2003 | Kutkut et al. |
| 7,859,223 | B2 | 12/2010 | Gorbold |
| 7,893,656 | B2 * | 2/2011 | Sobue ................ G01R 31/3658 320/122 |
| 8,084,997 | B2 * | 12/2011 | Miyamoto ........... G01R 31/362 320/134 |

(Continued)

OTHER PUBLICATIONS

Analog Devices Inc., "Lithium Ion Battery Monitoring System", AD7280 Datasheet, Rev. PrD, Aug. 2008, pp. 1-33.

*Primary Examiner* — Richard V Muralidar
(74) *Attorney, Agent, or Firm* — Schwegman Lundberg & Woessner, P.A.

(57) ABSTRACT

Embodiments of the present invention may provide a battery monitor for a battery system that avoids current loops. A battery monitor may be provisioned as an integrated circuit and may include a pair of supply pins for reception of power to the integrated circuit, a third high impedance pin, and a voltage regulation circuit. When the circuits are deployed, the supply pins of several battery monitors may be connected to each other to form a stack. The high impedance inputs of each battery monitor may be coupled to low voltage terminals of an associated battery cell. A voltage reference circuit within the battery monitor may maintain the voltage at a low voltage supply of the monitors at a level that matches the voltage present on the high impedance input. Thus, the voltages on the monitors' low voltage supplies may be regulated. As a result, no current should flow through the high impedance pins of the battery monitor. All current flow should occur through a single loop that extends through the entire stack of battery monitors.

24 Claims, 3 Drawing Sheets

(56) References Cited

U.S. PATENT DOCUMENTS

| | | | |
|---|---|---|---|
| 8,130,000 B2 * | 3/2012 | Botker | G01R 31/3658 324/429 |
| 8,222,907 B2 | 7/2012 | Streit | |
| 8,258,792 B2 * | 9/2012 | Vandensande | H02J 7/0021 320/162 |

* cited by examiner

DEVICE AND METHOD FOR EQUALIZING CURRENT DRAIN FROM A BATTERY STACK

RELATED U.S. APPLICATION

This application claims the benefit of U.S. Provisional Patent Application No. 61/653,829 filed on May 31, 2012, which is incorporated herein by reference.

FIELD OF INVENTION

The present invention relates to battery stack, and more particularly, to a system and method for equalizing current drain from a battery stack.

BACKGROUND

Battery stacks typically are used in hybrid electric vehicles and/or electric vehicles (collectively, "HEV/EV"). A battery stack, at its name implies, contains several battery cells connected in series to form a stacked structure. The battery stack generates electrical power to run a motor, which propels the HEV/EV. During operation of a battery stack, electrical circuits called "battery monitors" measure a several characteristics of the cells in the battery stack, such as overall voltage, voltage per battery cell, temperature, state of charge, etc. A battery monitor is an electrical circuit, typically provided in a unitary integrated circuit that measures these characteristics across individual cells of the battery stacks and reports measured data to a processing system. The battery monitors, therefore, monitor and confirm reliable operation of individual battery cells and the battery stack as a whole.

Conventional battery systems may include a plurality of batteries in a stacked configuration. Several factors contribute to reduced efficiency and lifespan of battery systems. One such factor is the need for cell balancing, and more frequent cell balancing increases power demands such that efficiency is reduced. In addition, stacked battery systems typically suffer from a host of electromagnetic interference (EMI), hot swap, and electrostatic discharge (ESD) effects.

Accordingly, the inventor recognized a need for a battery stack and monitoring system that is more efficient and provides enhanced immunity to EMI, hot swap, and ESD effects.

DETAILED DESCRIPTION

Reference will now be made in detail to the embodiments of the present invention, examples of which are illustrated in the accompanying drawings. Wherever possible, like reference numbers will be used for like elements. It is to be understood that both the foregoing general description and the following detailed description are exemplary and explanatory and are intended to provide further explanation of the invention as claimed.

Embodiments of the present invention may provide a battery stack monitor system for a battery system that avoids the drawbacks of conventional battery stack monitor system. A battery monitor may be provisioned as an integrated circuit and may include a pair of supply pins for reception of power to the integrated circuit, a third high impedance pin, and a voltage regulation circuit. When the circuits are deployed, the supply pins of several battery monitors may be connected to each other to form a stack. The high impedance inputs of each battery monitor may be coupled to low voltage terminals of an associated battery cell. A voltage regulator circuit within the battery monitor may fix the voltage at a low voltage supply of the monitors at a level that matches the voltage present on the high impedance pin. Thus, the voltages on the monitors' low voltage supplies may be regulated.

Figure 1:
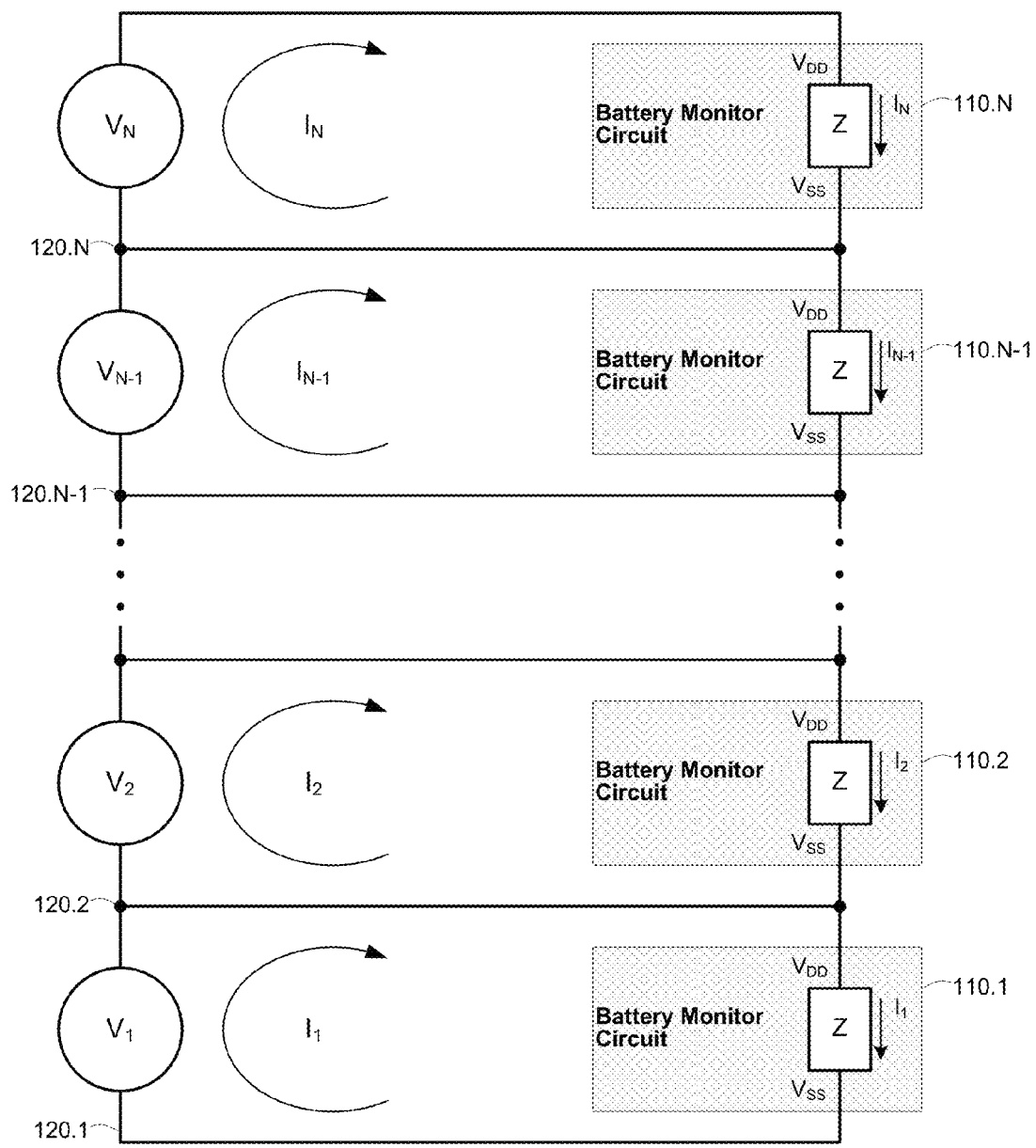
FIG. 1 is a simplified block diagram of a conventional battery stack monitoring system.

FIG. 1 is a simplified block diagram of a conventional battery stack monitoring system. As shown in FIG. 1, a conventional battery system 100 includes a plurality of batteries $V_1$-$V_N$ (each of which could include a stack of battery cells, as desired) and battery monitors 110.1-110.N each in a stacked configuration. For example, a high voltage terminal of battery $V_1$ is connected to a low voltage terminal of battery $V_2$ at node 120.2, a high voltage terminal of battery $V_2$ is connected to a low voltage terminal of an adjacent battery $V_3$ (not shown), and so forth. Battery monitors 110.1-110.N are connected to respective batteries $V_1$-$V_N$ from the stack. Thus, $V_{DD}$ and $V_{SS}$ supply pins of battery monitor 110.1 are connected respectively to high and low voltage terminals of its associated battery $V_1$ (nodes 120.1, 120.2). $V_{DD}$ and $V_{SS}$ supply pins of battery monitor 110.2 are connected respectively to high and low voltage terminals of its associated battery $V_2$ respectively (nodes 120.2, 120.3 (not shown)). The $V_{DD}$ supply of one battery monitor (e.g., monitor 110.1) and the $V_{SS}$ terminal of a neighboring battery monitor (e.g., monitor 110.2) are connected to a common node 120.1 between two adjacent batteries $V_1$, $V_2$. This connection scheme continues for each battery monitor 110.1-110.N of the stack. For the purposes of the present discussion, it is immaterial whether each battery $V_1$, $V_2$, etc. is provided as an individual battery cell or a stack of cells.

Each battery monitoring circuit 110.1-110.N includes a variety of monitoring circuits represented by a load Z in FIG. 1, which may have test input connections to the battery stack (not shown) as may be appropriate for the types of monitoring that are to be performed by the circuits 110.1-110.N. These circuits are a load on the cell stack, drawing current $I_1$ from the supply pins $V_{DD}$ and $V_{SS}$ of the respective battery monitor 110.1-110.N in which they reside. Current balance between $I_1$-$I_N$ is especially critical when the vehicle is not in operation and the battery monitoring circuits are the primary loads. During operation of the battery monitoring system 100, current flows from each battery $V_1$-$V_N$ through the $V_{DD}$ supply pin of an associated battery monitor 110.1-110.N, through the battery monitor's testing circuit Z, through the $V_{SS}$ supply pin of the battery monitor 110.1-110.N and back to the source battery $V_1$-$V_N$. Consequently, current loops $I_1$-$I_N$ are formed between each battery $V_1$-$V_N$ and a corresponding battery monitor 110.1-110.N. As a result, the current flowing through each battery monitor 110.1-110.N may be different with a load imbalance.

Imbalanced loads (Z) results in different discharge rate of each cell stack producing an unbalanced cell stack voltages. Corrective action, such as cell balancing, is utilized to maximize cell stack balance to maximize cell lifetime and efficiency of the batteries $V_1$-$V_N$ in the battery stack. The more imbalanced the cell loads the more frequent cell balancing, leading to increased power loss and less efficiency.

Moreover, HEV/EV battery systems typically suffer from a host of EMI, hot swap, and ESD effects. Additional measures are needed to ensure that EMI, hot swap, and ESD conducted via the battery stack cabling does not affect operation of the battery monitoring circuit, since it is required to maintain a low impedance path between the battery cells and associated battery monitoring circuits' supply. EMI, hot swap, and ESD can alter the integrity of battery monitors' measurements, which may lead to erroneous data and may also result in circuit damage.

Figure 2:
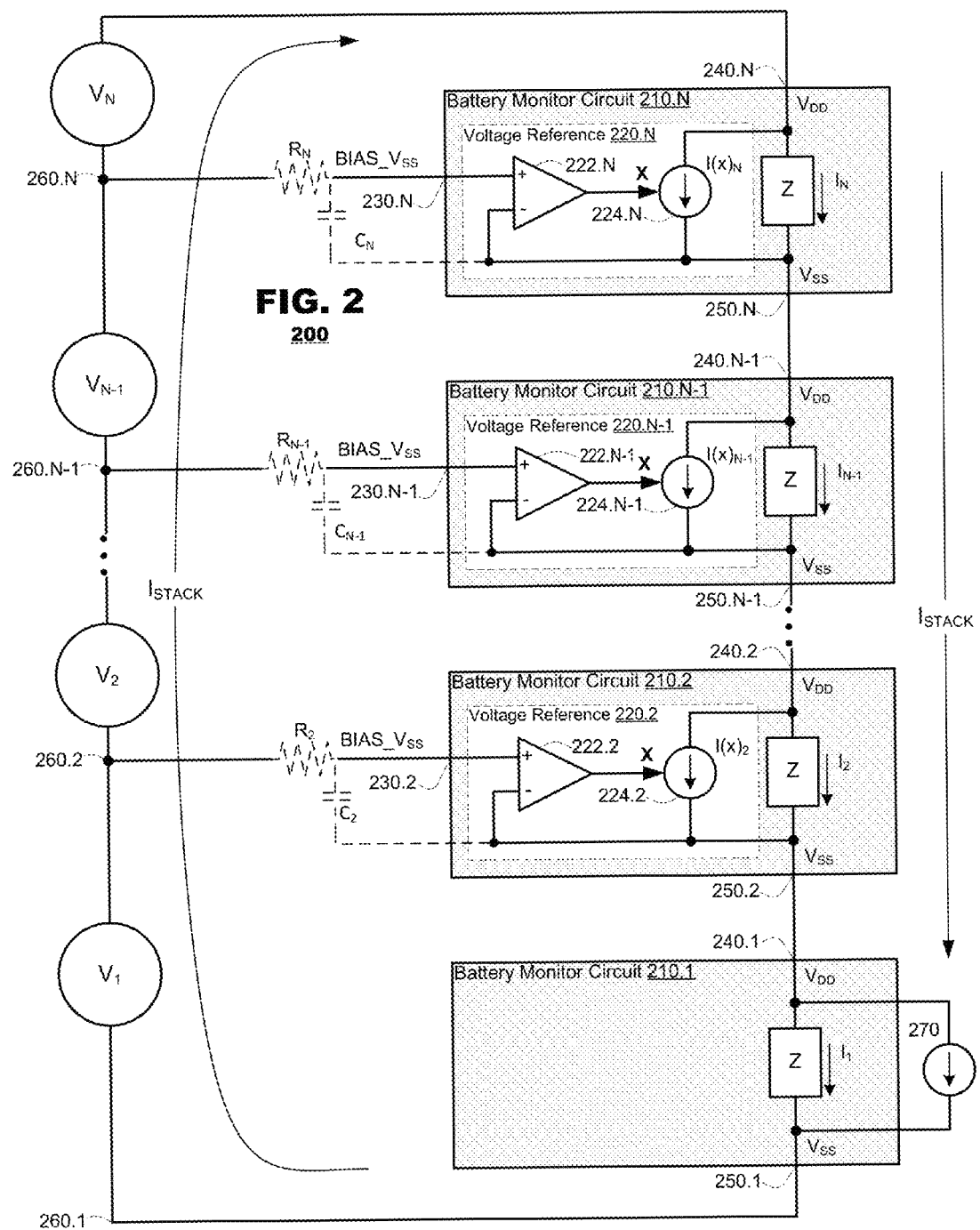
FIG. 2 is a block diagram of a battery stack monitoring system according to an example embodiment of the present invention.

FIG. 2 is a simplified block diagram of a battery monitoring system 200 according to an example embodiment of the present invention. The battery monitoring system 200 may include a plurality of batteries $V_1$-$V_N$ in a stack configuration (for example, a high voltage terminal of $V_1$ may be connected to a low voltage terminal of $V_2$, a high voltage terminal of $V_2$ may be connected to a low voltage of $V_{N-1}$, and so forth). $V_1$ through $V_N$ each may include a stack of cells. The battery monitoring system 200 may include a plurality of battery monitoring circuits, 210.1-210.N, in which high and low voltage supplies $V_{DD}$ (pins 240.1-240.N) and $V_{SS}$ (pins 250.1-250.N) of each chip are connected to each other to form a stack. The high voltage supply $V_{DD}$ (pin 240.N) of a top battery monitor 210.N in the stack may be connected to a high voltage terminal of a top battery $V_N$ in the battery stack. Similarly, the low voltage supply $V_{SS}$ (pin 250.1) of a lowest battery monitor 210.1 in the stack may be connected to a low voltage terminal of a lowest battery $V_1$ in the battery stack. All supply current (shown as $I_{STACK}$) for the battery monitors 210.1-210.N may flow from the $V_{DD}$ pin of the top battery monitor 210.N, through the $V_{SS}$-to-$V_{DD}$ connections (nodes 250.2-250.N) of the intermediate battery monitors 210.2-210.N−1 and through the $V_{SS}$ pin of the bottom battery monitor 210.1.

Each battery monitoring circuit 210.1-210.N includes a variety of monitoring circuits represented by a load Z in FIG. 2, which may have test input connections to the battery stack (not shown) as may be appropriate for the types of monitoring that are to be performed by the circuits 210.1-210.N. Each battery monitoring circuit 210.1-210.N may have a variety of modes (e.g. full, balance, stand-by, sleep) where each mode will correspond to a specific impedance Z. Variations in Z may also arise due to process variations between battery monitor circuits.

With the exception of battery monitoring circuit 210.1, battery monitoring circuits 210.2-210.N may include reference circuits 220.2-220.N coupled to the $V_{SS}$ pins of the respective battery monitors 210.2-210.N. The reference circuits 220.2-220.N each may have a high impedance input terminal 230.2-230.N connected to nodes 260.2-260.N between the batteries $V_1$-$V_N$. The voltage reference circuits 220.2-220.N may maintain voltages at the $V_{SS}$ terminals 250.2-250.N at a common level as the voltages present on corresponding nodes 260.2-260.N respectively. Optionally, as discussed below, circuit 210.1 could have an architectures similar to the circuits 210.2-210.N.

As illustrated in FIG. 2, a battery monitoring circuit 210.1 at the bottom of the stack may include a current supply 270 coupled in parallel with the impedance load Z. The current supply can be controlled by a corresponding control circuit (not shown) associated with battery monitoring circuit 210.1 and sized to ensure that the current $I_{STACK}$ flowing through the stack is sufficient to satisfy needs of the monitor circuit having the greatest current needs.

During operation, a single current loop $I_{STACK}$ may be formed that extends through the entire battery stack $V_1$-$V_N$ and the entire stack of battery monitors 210.1-210.N. The reference circuits 220.1-220.N may operate to maintain voltages at the low supply terminals $V_{SS}$ (pins 250.1-250.N) of each battery monitor 210.1-210.N at values that match voltages present on an associated node 260.1-260.N−1 of the battery stack. By setting the voltage at the low supply pin $V_{SS}$ (e.g., pin 250.N) of a battery monitor circuit (e.g., monitor 210.N), the voltage reference circuit (e.g., 220.N) also sets the voltage of the high voltage supply pin $V_{DD}$ (e.g., 240.N−1) of a next lower battery monitor 210.N−1, without drawing appreciable current at the reference circuit's high impedance input 230.N.

Also depicted in FIG. 2 is an example structure of a voltage reference circuit 220.N according to an example embodiment of the present invention. The voltage reference circuit 220.N may include an amplifier 222.N (e.g., a non-inverting unity gain amplifier) for controlling a variable current sink 224.N. An inverting input to the amplifier 222.N may be connected to the $V_{SS}$ pin 250.N of the battery monitor 210.N and a non-inverting input may be connected to the low voltage node 260.N of an associated battery $V_N$. The other voltage reference circuits 220.2-220.N−1 may be provisioned in a substantially similar manner as known in the art.

The amplifier 222.N may operate as a unity gain amplifier where the current sink 224.N may conduct an amount of current, shown as $I(x)_N$. This current $I(x)_N$ circumvents current consumed by the monitoring circuit Z of the battery monitor 210.N. In this manner, the voltage reference circuit 220.N maintains the voltage at its $V_{SS}$ terminal (node 250.N) at the same level as the voltage at node 260.N. The other battery monitor circuits 210.2-210.N−1 operate in a substantially similar manner to circuit 210.N. Because the inputs 230.2-230.N of the battery monitor circuits 210.1-210.N each are high impedance, insignificant current is expected to flow from the nodes 260.2-260.N through those inputs 230.2-230.N. Accordingly, it is expected that a single current loop will be formed within the system 200, represented by ISTACK rather than multiple current loops of other configurations.

Optionally, the voltage reference circuits 220.1-220.N may include a programmable offset controller (not shown) which may introduce an offset component into the control signal input to the current sinks 224.1-224.N−1. During operation, the offset controller may add a predetermined offset value to an output signal generated by amplifier 222.N (which may be zero in appropriate circumstances).

As indicated, the battery monitor circuit 210.1 in a lowest stack position may have a current source 270 in parallel with Z load in battery monitor circuit 210.1 to provide current in the loop sufficient to serve the most power hungry monitor within the stack. In another embodiment, rather than provide a separate current driver 270, the battery monitor 210.1 itself may be provisioned with the current driver 270 that is set to a programmable level within the circuit 210.1 as specified by a control register (not shown).

Figure 3:
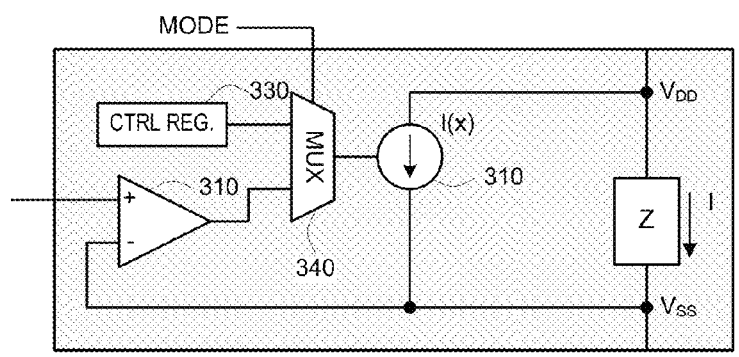
FIG. 3 is a functional block diagram of battery monitor according to another example embodiment of the present invention.

Alternatively, each battery monitoring circuit 210 may include a current sink that can be controlled either by an amplifier or the control register. This configuration is shown functionally in FIG. 3, where a battery monitor 300 is shown as having an amplifier 310, current sink 320, control register 330 and a multiplexer 340. The multiplexer 340 may accept a mode control signal that determines which of the amplifier 310 or the control register 330 controls the current sink 320. When the battery monitor 300 is placed at the bottom of a battery stack, for example, as battery monitor 210.1 in FIG. 2, the mode signal may control the multiplexer 340 to cause the control register 330 to control the current sink 320. When the battery monitor is placed at other positions of the stack, for example in the position of monitors 210.2-210.N in FIG. 2, the mode signal may control the multiplexer 340 to cause the amplifier 310 to control the current sink 320. Thus, battery monitors may be manufactured according to a single design and yet find application at different positions within a battery stack.

Returning to FIG. 2, in another embodiment, resistors $R_2$-$R_N$ and/or capacitors $C_2$-$C_N$ may be placed between the nodes 260.2-260.N of the batteries $V_1$-$V_N$ and the high impedance inputs 230.2-230.N of the battery monitor circuits 210.2-210.N. The capacitors $C_2$-$C_N$ and resistors $R_2$-$R_N$ may form low pass filters on the monitor inputs 231.2-230.N to minimize EMI susceptibility. The $R_2$-$R_N$ resistors can be adapted to prevent damage to the battery monitor system 200 by limiting current during "hot swap" (for example, when one battery monitor is replaced during operation of the system) or ESD. The resistors $R_2$-$R_N$ may have robust impedances suitable for use in HEV/EV systems where voltages of several hundred volts typically are present. For example, the $R_1$-$R_N$ resistors may have resistances of 10 kΩ or more to limit currents during hot swap and ESD.

FIG. 2 presents functional block diagrams of the voltage reference circuits 220.2-220.N. The voltage reference circuits may be implemented in a variety of ways. Two embodiments are illustrated in FIGS. 4 and 5 respectively.

Figure 4:
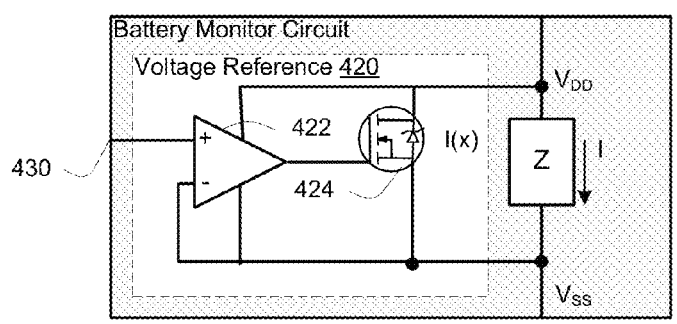
FIGS. 4 and 5 are circuit diagrams of a battery monitor voltage reference circuits according to various embodiments of the present invention.
Figure 5:
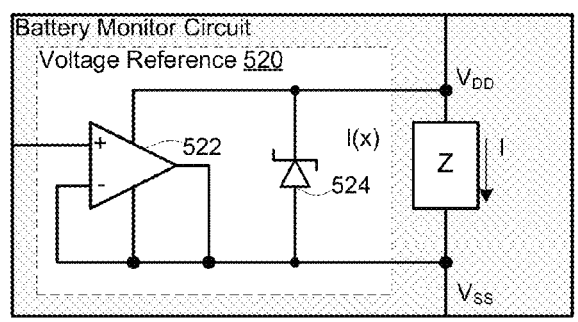

FIG. 4 illustrates a battery monitor 400 according to an example embodiment of the present invention. The battery monitor 400 may include a testing circuit Z and a voltage reference circuit 420. The battery monitor 400 may have test inputs (not shown) that connect the testing circuit Z to an associated battery to measure characteristics of each battery such as overall voltage, voltage per battery cell (not shown), temperature, state of charge, etc. The voltage reference circuit 420 may have a high impedance input 430 coupled to a low voltage terminal of an associated battery (not shown) and a second input coupled to a $V_{SS}$ pin 450 of the battery monitor 400.

The voltage reference circuit 420 may include an amplifier 422 (e.g., a non-inverting unity gain amplifier) and a current sink 424. An inverting input to the amplifier 422 may be connected to the $V_{SS}$ pin 450 of the battery monitor 400 and a non-inverting input may be connected to input 430, which is to be connected to a low voltage node of an associated battery in a battery stack. In the embodiment illustrated in FIG. 4, the current sink 424 may be provided as a FET transistor whose gate is coupled to an output of the amplifier 422.

The battery monitor 400 may find application in the battery stack system as illustrated in FIG. 2. The battery monitor circuit 400 may have a pair of high and low voltage supply pins 440 and 450 for connection to local $V_{DD}$ and $V_{SS}$ supplies of the battery monitor 400. As in the case of FIG. 2, a plurality of battery monitors 400 may be provided in a stacked configuration, which are connected to each other by $V_{DD}$ and $V_{SS}$ supply pins. Thus, the $V_{DD}$ pin 440 of one battery monitor 400 may be connected to a $V_{SS}$ pin 450 of an adjacent battery monitor (not shown in FIG. 4) to form a stack. Similarly, the $V_{SS}$ pin 450 of one battery monitor 400 may be connected to a $V_{DD}$ pin 440 of an adjacent battery monitor (not shown in FIG. 4) within the stack. As in the FIG. 2 embodiment, the input 430 is high impedance and, therefore, the battery monitor 400 will achieve a single omnibus current loop as shown in FIG. 2 when assembled into a stack rather than individual current loops as in the FIG. 1 configuration.

The amplifier 422 may operate as a unity gain amplifier where the current sink 424 may conduct an amount of current, shown as $I(x)_N$. In response to an amplifier output signal, conductivity of the variable impedance transistor 424 may change which may regulate an amount of current $I(x)$ passing through it. This current $I(x)$ bypasses current the circuits Z of the battery monitor 400. In this manner, the voltage reference circuit 420 maintains the voltage at the $V_{SS}$ pin 450 at the same level as the voltage at the low voltage terminal of the battery monitor's associated battery (not shown), the voltage at input terminal 430.

FIG. 5 illustrates a battery monitor 500 according to another embodiment of the present invention. In this embodiment, the voltage reference circuit 520 may include an operational amplifier ("op amp") 522 and a zener diode 524. In this embodiment, an output terminal of the op amp 522 is coupled to the VSS terminal of the battery monitor 500 and to the op amp's negative input terminal. The zener diode 524 is shown connected between the battery monitor's VDD and VSS terminals. Again, the voltage reference circuit 520 operates to maintain a voltage at the VSS terminal at a level that corresponds to the voltage presented at the op amp's positive input terminal 540.

The example embodiments described above with respect to FIGS. 2-3 are advantageous as compared to the conventional battery stack monitoring system described with respect to FIG. 1. As previously discussed, the embodiments of the present invention may balance current drain for all the batteries in a battery stack. As a result, the architecture of the embodiments of the present invention reduces EMI susceptibility of the system. Additionally, the high value resistors placed between batteries in a stack and battery monitors in a stack may reduce the system's susceptibility to damage during ESD or "hot swap" (for example, replacing a damaged battery monitoring circuit during continued operation of the system can damage other battery monitoring circuits and batteries in the system).

While specific implementations and hardware configurations for the battery stack system have been illustrated, it should be noted that other implementations and hardware configurations are possible and that no specific implementation or hardware configuration is needed. Thus, not all of the components illustrated may be needed for the device implementing the methods disclosed herein.

It will be apparent to those skilled in the art that various modifications and variations can be made in the battery stack of the present invention without departing from the spirit or scope of the invention. Thus, it is intended that the present invention cover the modifications and variations of this invention provided they come within the scope of the appended claims and their equivalents.

What is claimed is:

1. A battery monitor, comprising:
 a testing circuit having a test input for connection to a battery, the testing circuit having supply inputs for connection to power inputs of the battery monitor, and
 a voltage reference circuit having a high impedance input and an output, the high impedance input provided for connection to a low voltage terminal of the battery and the output connected to one of the supply inputs, the reference circuit adapted to maintain a voltage at the connected power input at a common level as a voltage on the high impedance input.

2. The battery monitor of claim 1, wherein the voltage reference circuit comprises a comparator.

3. The battery monitor of claim 1, wherein the voltage reference circuit includes a current sink connected between the power inputs to the battery monitor and having a control input coupled to an output of an amplifier.

4. The battery monitor of claim 1, wherein the voltage reference circuit includes a variable impedance transistor adapted to establish a conduction path between the power inputs to the battery monitor and having a control input coupled to an output of an amplifier.

5. The battery monitor of claim 1, wherein the voltage reference circuit comprises:
   a current sink connected between the power inputs to the battery monitor and having a control input coupled to an output of an amplifier, and
   a current sink controller coupled to the input, the current sink controller to output a control signal including an offset component.

6. The battery monitor of claim 1, wherein the voltage reference circuit accepts negligible current on the high impedance input.

7. A battery monitor system, comprising:
   a plurality of battery monitors, each having a pair of supply pins for high and low power inputs to the respective battery monitor, the supply pins of a portion of the plurality of battery monitors connected to supply pins of other battery monitors to form a chain in which high voltage supply pins of the battery monitors in intermediate positions of the chain each are connected to a low voltage supply pin of an adjacent battery monitor in the chain and in which low voltage supply pins of the battery monitors in intermediate positions of the chain each are connected to a high voltage supply pin of an adjacent battery monitor in the chain; and
   each battery monitor in the intermediate positions comprising a testing circuit and a voltage reference circuit, the voltage reference circuit having a high impedance input and an output, the high impedance input for connection to a voltage terminal of a battery and the output connected to one of the supply pins, the reference circuit to maintain a voltage at the connected supply pin at a common level as a voltage on the high impedance input.

8. The battery monitor system of claim 7, wherein the battery monitor in a top position of the chain comprises a voltage reference circuit having a high impedance input and an output, the high impedance input for connection to a voltage terminal of another battery and the output connected to one of the supply pins, the reference circuit to maintain a voltage at the connected supply pin at a common level as a voltage on the high impedance input.

9. The battery monitor system of claim 7, wherein the battery monitor in a bottom position of the chain comprises a current source controlled by a programmable control register.

10. The battery monitor system of claim 7, further comprising a stack of batteries, wherein an input of each battery monitor is connected to a terminal of a respective battery in the stack.

11. The battery monitor system of claim 7, wherein the voltage reference circuit of at least one battery monitor comprises a comparator.

12. The battery monitor system of claim 7, wherein the voltage reference circuit of at least one battery monitor comprises an amplifier.

13. The battery monitor system of claim 12, wherein the voltage reference circuit of at least one battery monitor includes a current sink connected between the power inputs to the battery monitor and having a control input coupled to an output of the amplifier.

14. The battery monitor system of claim 13, wherein the voltage reference circuit of at least one battery monitor includes a variable impedance transistor for establishing a conduction path between the power inputs to the battery monitor and having a control input coupled to an output of the amplifier.

15. The battery monitor system of claim 12, wherein the voltage reference circuit of at least one battery monitor comprises:
   a current sink connected between the power inputs to the battery monitor and having a control input coupled to an output of the amplifier, and
   a current sink controller coupled to the input, the current sink controller to output a control signal including an offset component.

16. The battery monitor system of claim 7, wherein the voltage reference circuit of at least one battery monitor accepts negligible current on the high impedance input.

17. A method for regulating voltage of a stack of batteries, comprising:
   conducting a current from the battery stack through a stack of associated battery monitor circuits, wherein voltage supply pins of battery monitors within the stack are connected to voltage supply pins of adjacent battery monitors of the stack,
   regulating voltages at the supply pins of the battery monitors at intermediate positions in the stack by comparing, for each battery monitor, a voltage at the regulated supply pin to a voltage present at a terminal of a battery connected to the respective battery monitor.

18. The method of claim 17, wherein the regulating includes conducting, through a bypass path of each battery monitor, an amount of current for the respective battery monitor.

19. The method of claim 18, wherein, when a voltage at the regulated supply pin of a battery monitor exceeds a voltage at the terminal of the battery connected to the respective battery monitor, increasing the amount of current conducted through the bypass path of the respective battery monitor.

20. The method of claim 18, wherein, when a voltage at the regulated supply pin of a battery monitor is less than a voltage the terminal of the battery connected to the respective battery monitor, decreasing the amount of current conducted through the bypass path of the respective battery monitor.

21. The method of claim 17, wherein each battery monitor accepts negligible current through an input connecting the battery monitor to the terminal of the battery connected to the respective battery monitor.

22. The method of claim 17, wherein the regulating voltages at the supply pins of the battery monitors is performed by a voltage reference circuit that includes an op amp with an inverting input connected to a low supply pin and a non-inverting input connected to a high impedance input of the voltage reference circuit.

23. A system for monitoring a battery stack, the system comprising:

a first battery monitor, the first battery monitor comprising:
  a first low voltage power input;
  a first high voltage power input;
  a first testing circuit comprising a first test input for connection to a first battery of the battery stack; a first supply input for connection to the first high voltage power input; and a second supply input for connection to the first low voltage power input; and
  a first voltage reference circuit comprising a first high impedance input for connection to a low voltage terminal of the first battery; and a first voltage reference output connected to the first low voltage power input, wherein the first voltage reference circuit is adapted to maintain a voltage at the first low voltage power input that is substantially the same as a voltage at the low voltage terminal of the first battery; and
a second battery monitor comprising:
  a second low voltage power input;
  a second high voltage power input connected to the first low voltage power input,
  a second testing circuit comprising a second test input for connection to a second battery of the battery stack, a third supply input for connection to the second high voltage power input; and a fourth supply input for connection to the second low voltage power input; and
  a second voltage reference circuit comprising a second high impedance input for connection to a low voltage terminal of the second battery; and a second voltage reference output connected to the second low voltage power input, wherein the second voltage reference circuit is adapted to maintain a voltage at the second low voltage power input that is substantially the same as a voltage at the low voltage terminal of the second battery.

24. The system of claim 23, further comprising a third battery monitor, comprising:
  a third high voltage power input connected to the second low voltage power input;
  a third low voltage power input;
  a programmable control register; and
  a current source controlled by the programmable register, the current source having a current source input connected to the third high voltage power input and a current source output connected to a third low voltage power input of the third battery monitor.

* * * * *

UNITED STATES PATENT AND TRADEMARK OFFICE
CERTIFICATE OF CORRECTION

PATENT NO. : 9,513,339 B2
APPLICATION NO. : 13/905948
DATED : December 6, 2016
INVENTOR(S) : Lawrence C. Streit Page 1 of 1

It is certified that error appears in the above-identified patent and that said Letters Patent is hereby corrected as shown below:

In the Claims

In Column 9, Line 22, in Claim 23, delete "input," and insert --input;--, therefor In Column 9, Line 25, in Claim 23, delete "stack," and insert --stack;--, therefor Signed and Sealed this
Thirteenth Day of February, 2018

Andrei Iancu
*Director of the United States Patent and Trademark Office*